(12) United States Patent  
Shim et al.

(10) Patent No.: US 7,446,408 B2
(45) Date of Patent: Nov. 4, 2008

(54) SEMICONDUCTOR PACKAGE WITH HEAT SINK

(75) Inventors: Il Kwon Shim, Singapore (SG); Seng Guan Chow, Singapore (SG); Gerry Balanon, Singapore (SG)

(73) Assignee: ST Assembly Test Services Pte Ltd, Singapore (SG)

( * ) Notice: Subject to any disclaimer, the term of this patent is extended or adjusted under 35 U.S.C. 154(b) by 917 days.

(21) Appl. No.: 10/462,288

(22) Filed: Jun. 16, 2003

(65) Prior Publication Data

US 2003/0216024 A1 Nov. 20, 2003

Related U.S. Application Data

(62) Division of application No. 09/961,555, filed on Sep. 24, 2001, now Pat. No. 6,599,779.

(51) Int. Cl.
*H01L 23/34* (2006.01)

(52) U.S. Cl. .................... 257/706; 257/707; 257/718; 257/720; 257/796; 257/E23.08

(58) Field of Classification Search ............ 257/619, 257/706–707, 718–719, 778, 796
See application file for complete search history.

(56) References Cited

U.S. PATENT DOCUMENTS

| | | | | |
|---|---|---|---|---|
| 3,955,122 | A * | 5/1976 | Maynard et al. | 361/710 |
| 5,641,987 | A | 6/1997 | Lee | 257/675 |
| 5,834,839 | A | 11/1998 | Mertol | 257/704 |
| 5,872,395 | A | 2/1999 | Fujimoto | 257/675 |
| 5,977,626 | A | 11/1999 | Wang et al. | 257/707 |
| 6,008,991 | A * | 12/1999 | Hawthorne et al. | 361/707 |
| 6,188,578 | B1 * | 2/2001 | Lin et al. | 361/717 |
| 6,201,301 | B1 | 3/2001 | Hoang | 257/712 |
| 6,329,603 | B1 * | 12/2001 | Japp et al. | 174/255 |
| 6,528,876 | B2 * | 3/2003 | Huang | 257/706 |
| 6,559,536 | B1 * | 5/2003 | Katoh et al. | 257/712 |

* cited by examiner

*Primary Examiner*—Thanh Nguyen

(57) ABSTRACT

A package is provided for a semiconductor device including a semiconductor device support substrate having at least one interconnect metal therein connectible to a ground and having at least one opening exposing the surface of the interconnect metal. A heat sink has elastic means integral therewith for cooperating with the opening to position and secure the heat sink to the semiconductor support substrate.

20 Claims, 3 Drawing Sheets

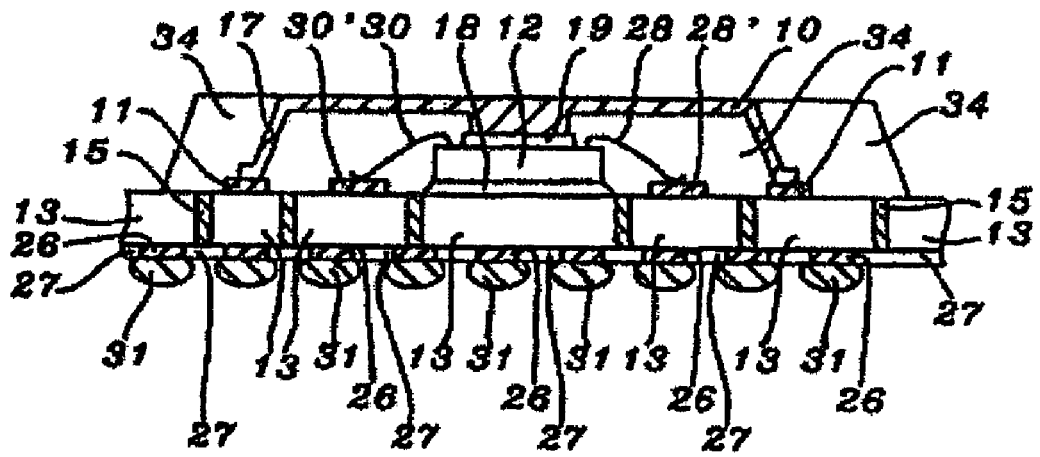
FIG. 1 – Prior Art
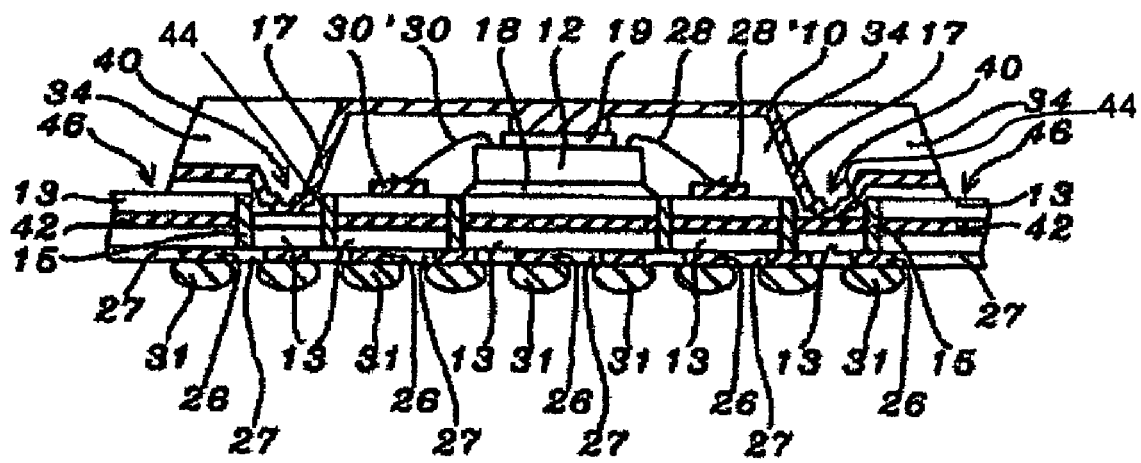
FIG. 2

SEMICONDUCTOR PACKAGE WITH HEAT SINK

This is a division of patent application Ser. No. 09/961,555, filed on Sep. 24, 2001 now U.S. Pat. No. 6,599,779 B2, titled "PBGA Substrate For Anchoring Heat Sink", assigned to the same assignee as the present invention.

BACKGROUND OF THE INVENTION (1) Field of the Invention

The invention relates to the fabrication of integrated circuit devices, and more particularly, to a substrate that is used for creating a Ball Grid Array package.

(2) Description of the Prior Art

The semiconductor industry has since its inception achieved improvements in the performance of semiconductor devices by device miniaturization and by increasing the device packaging density.

One of the original approaches that has been used to create surface mounted, high pin count integrated circuit packages has been the use of the Quad Flat Pack (QFP) with various pin configurations. For the QFP, closely spaced leads along the four edges of the flat package are used for making electrical connections from where the electrical connections are distributed to the surrounding circuitry. The input/output (I/O) connections that can be made to the QFP are therefore confined to the edges of the flat package, which limits the number of I/O connections that can be made to the QFP even in applications where the pin to pin spacing is small. The QFP has found to be cost-effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package, eliminating the restriction of having I/O connects only around the periphery of the package. More contact points with greater spacing between the contact points can therefore be allocated across the BGA package than was the case with the QFP. The contact points that are used for the BGA package are typically solder balls that have the added advantage of facilitating reflow soldering of the package onto a printed circuit board.

Prior Art substrate packaging uses ceramic and plastic BOA packaging. Ceramic substrate packaging is expensive and has proven to limit the performance of the overall package. Recent years have seen the emergence of plastic BGA packaging; this packaging has become the main stream design and is frequently used in high volume BGA package fabrication. The substrate of Plastic BGA (PBGA) package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the substrate structure becomes complicated and expensive.

The invention addresses placing of a heatsink that is used in PBGA packages in either a die-up and or a die-down mold chase.

U.S. Pat. No. 5,872,395 (Fujimoto) shows a heat spreader using a mold compound and a mold cavity.

U.S. Pat. No. 5,641,987 (Lee) shows another similar heat spreader design.

U.S. Pat. No. 5,977,626 (Wang et al.) U.S. Pat. No. 6,201,301 (Hoang) and U.S. Pat. No. 5,834,839 (Mertol) show related heat spreaders and methods.

SUMMARY OF THE INVENTION

A principle objective of the invention is to provide a method of mounting a heat shield over a semiconductor substrate such that the heat shield is positioned precisely, preventing problems of heat shield shifting or tilting.

Another principle objective of the invention is to provide a method of mounting a heat shield over a semiconductor substrate such that the heat shield is firmly held in place, preventing problems of heat shield shifting or tilting.

Another objective of the invention is to apply a heat sink over the surface of a substrate without the need for adhesive material.

Another objective of the invention is to provide a method for improved heat dissipation from the heat sink into the underlying substrate.

Yet another objective of the invention is to provide effective grounding connection between the heat sink and the surface of an underlying substrate.

A still further objective of the invention is to remove the antenna effect that typically caused by the heat sink of a PBGA package.

A still further objective of the-invention is to provide good electromagnetic shielding of the semiconductor device that is mounted in a PBGA package.

In accordance with the objectives of the invention a new method is provided to position and secure a heat sink over the surface of a semiconductor device mounting support, the latter typically being referred to as a semiconductor substrate. A plurality of recesses is created in the surface of the substrate over which the heat sink is to be mounted. The heat sink is (conventionally and not part of the invention) provided with dimples that form the interface between the heat sink and the underlying substrate. The dimples of the heat sink are aligned with and inserted into the recesses that have been created by the invention in the underlying substrate for this purpose, firmly securing the heat sink in position with respect to the substrate.

BRIEF DESCRIPTION OF THE DRAWINGS

FIG. 1 shows a cross section of a Prior Art Plastic Ball Grid Array (PBGA) package.

FIG. 2 shows a cross section of the application of the substrate of the invention to a PBGA package.

DESCRIPTION OF THE PREFERRED EMBODIMENTS

Figure 3:
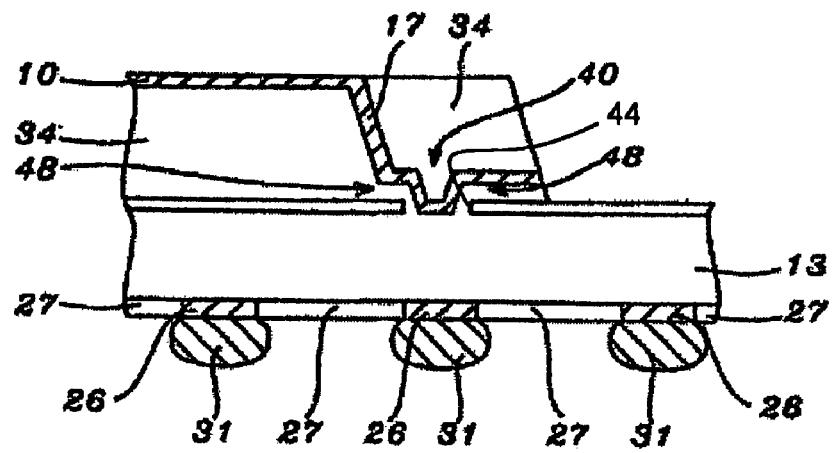
FIG. 3 shows a first detail of the alignment of the dimples of a heat sink with the recesses that are created in the PBGA substrate of the invention.

In typical Prior Art cavity-down enhanced BGA packages a major part of the package in made up of a heatsink, whereby the heatsink has a surface that is electrically conductive. The top of the IC chip is in close physical contact with the heatsink via a thin adhesive layer of thermally conductive epoxy that is deposited over the physical interface between the IC die and the heat sink. Contact points of the IC die are conductively bonded, using wire-bonding techniques, to a conductive layer of the supporting substrate of the package.

The substrate that is used for IC packages can contain multiple layers of interconnect metal in addition to conductive vias and contact points for the interconnection of overlying layers of metal. A mechanical stiffener can be part of the IC substrate to provide rigidity to the substrate. Contact balls are attached to a first surface of the IC substrate, the contact balls make electrical contact with conductive traces on the first surface of the IC substrate. The conductive traces on the first surface of the substrate further interconnect the solder balls to surrounding circuitry or functional elements. Bond wires provide a wire-bond connection between contact points on the active surface of the IC die and conductive traces on a second surface of the substrate. A solder mask layer is deposited over the surfaces of the substrate to provide solder connections. The solder mask layer is provided with openings that are aligned with the contact balls and conductive traces on the first and second surfaces of the IC die substrate. The IC die is typically encapsulated using an encapsulation material surrounding the die and the bond wires.

For purpose of packaging semiconductor devices and for addressing thermal concerns of such packages, present trend in the industry is to place increased demands on the thermal performance of packaged devices coupled with low assembly and unit cost of the completed package. Generally, these increased demands are met by following one or more of the following approaches:

- by increasing the percentage of copper that is contained in the substrate over which the device is mounted; this can be accomplished by for instance increasing the routing density of the interconnect lines over the surface of the substrate or by increasing the paddle size of the die paddle over which the devices is mounted
- by including additional layers of metal in the substrate over which the devices is mounted
- by increasing the thickness of the metal planes contained in the substrate over which the device is mounted; this by for instance using a two-ounce thickness layer of copper as opposed to using a one-ounce thickness layer of copper, and
- by the addition of thermal pads, vias and solder balls over which the device is mounted.

In addition, an approach that is frequently taken is to provide for an external heat sink which can for instance be of a pin-fin or circular design; such a heat sink can be attached to a die-up PBGA package.

The prior art package that is shown in cross section in FIG. 1 follows closely the package of the invention. In the PBGA package of FIG. 1, the die 12 is mounted over the surface of substrate 13 and is adhered thereto by adhesive layer 18. Interconnect vias 15 have been provided through substrate 13, interconnecting conductive traces on a second surface of substrate 13, of which traces 28' and 30' are representative examples, with conductive traces on a first surface of substrate 13, of which traces 26 are representative examples. Heatsink 10 rests via contact arms 17 on contact adhesive 11 that are provided on the surface of substrate 13. Layer 19 is a layer of thermally conductive material that is selected so as not to inhibit heat transfer from die 12 to the heatsink 10. A mold compound 34 is formed over the surface of the structure, which further also surrounds bond wires 28 and 30. The location of the vias 15 passing through substrate 13 as shown in cross section in FIG. 1 is not representative of the actual location of those contact vias but is shown here to indicate that electrical contact is established by means of these vias between interconnect traces that are provide on both surface of substrate 13. Some of these vias 15 can also be used to establish a ground connection between the heat sink 10 and one or more of the contact balls 31.

Where the cross section that is shown in FIG. 1 shows a substrate that is provided with one layer of conductive traces over both the upper and the lower surface of substrate 13, a PBGA package is not limited to this but can contain, in the substrate 13, multiple layers of interconnect traces in overlying layers of patterned and etched metal. The limit to the number of layers that can be created as part of a IC substrate is largely determined by requirements of electrical performance of the PBGA package and by constraints imposed by manufacturing and reliability of the PBGA package.

PBGA packages can be created in either a die-down or a die-up configuration, which relates to and is indicative of the manner in which the cavity that is required for the housing of the IC die is positioned with respect to the cross section of the overall PBGA package. The example that has been detailed in FIG. 1 is a die-up application since the die, within the mold compound 34, faces upwards. From this the die-down application can readily be visualized.

When a die-down mold chase is used (for the formation of the layer 34 of mold compound that encases the PBGA package) the heat sink is positioned inside the mold cavity prior to forming the encapsulant (mold compound 34, FIG. 1) over the substrate and the heat sink. The heat sink is designed, as will be further explained at a later time, having self-alignment features to secure itself in the mold cavity, which means that no adhesive is required to physically attach the heat sink to the substrate. It is however possible that this manner of connection does not provide adequate grounding of the heat sink through the dimples (the interfaces between the heat sink and the IC supporting substrate) to the ground pads of the substrate, degrading the electrical performance of the package.

When a die-up mold chase is used, the heat sink must be bonded to the surface of the substrate using an adhesive material that is applied prior to the molding process. Prior art methods of using a jig (alignment tool) of a pick-and-place tool can then be applied to position the heat sink dimples such that these dimples land one the surface of the intended locations or ground pads on the surface of the IC supporting substrate. The adhesive layer has to be cured in order to secure the heat sink on the surface of the IC supporting substrate, this curing is performed prior to the molding process.

FIG. 2 is now used to describe the invention in detail. A number of the elements that are shown in the cross section of FIG. 2 have previously been explained under the cross section of FIG. 1. These elements remain in FIG. 2 as they have been explained for FIG. 1 and do therefore not need to be further explained at this time.

Of special interest to the invention are the areas of heat sink 10 that have been highlighted as areas 40. These are the sections of heat sink 10 that have been referred to as the dimples of the heat sink. The dimples of a heat sink are the parts of the heat sink 10 that form the physical interface between the legs 17 of heat sink 10 and the underlying IC supporting substrate 13. It has previously been indicated that substrate 13 may contain a multiplicity of interconnect and ground layers, one such layer has been highlighted in the cross section of FIG. 2 as layer 42, which in this case is defined as being the ground layer that is part of substrate 13. Of key significance to the invention are the openings 44 that have been created in the surface 46 of substrate 13. These openings 44 penetrate the substrate to the surface of layer 42, exposing the surface of ground layer 42. Openings 44 are used by the invention to position and secure the dimples 40, and with that the heat sink 10, with respect to the surface 46 of substrate 13. The openings 44 have, for reasons a clarity, been shown to be slightly larger in diameter than the dimples 40. It is however clear that the sloping outside surfaces of dimples 40 will, after the heat sink has been placed in position and in contact with layer 42, make contact with the corners of openings 44 where the sidewalls of openings 44 intersect with the surface 46 of substrate 13. A slight elasticity of the dimples 40 allows for the application of a (relatively small) pressure to the heat sink at the time that the heat sink is joined with the IC supporting substrate 13. Care must be taken in this however since an excess of force applied during this operation of assembly may result in creating cracks in the surface 46 of substrate 13, due to the large clamping force that is applied during the subsequent molding process.

Methods of laser drilling, plasma drilling, mechanical drilling or milling can be used to create a plurality of openings 44 in the surface 46 of substrate 13. The recesses that are created in this manner in the surface 46 of substrate 13 are used to anchor the heat sink dimples 40 as shown in the cross section of FIG. 2. The depth of the recesses that are created in substrate 13 must be such that the surface of a ground plane is exposed through the recesses, enabling the grounding to the ground plane of undesirable signals or noise, that are induced on the heat sink.

As a further step in grounding the heat sink of the invention, the recesses 40 that are formed in the substrate can be plated with for instance copper. This step of metal plating is optional. In addition, adhesive epoxy can be dispensed inside the recesses 44, the adhesive epoxy will securely affix the dimples 40, and with that the heat sink 10, to the IC supporting substrate 13.

It must be pointed out that it is desired to not create any openings (see regions 48, FIG. 3) between the lower surface of the dimples 40 and the surface 46 of substrate 13 where the lower surface of dimples 40 overlies the surface 46. This to avoid the formation of voids trapped and/or contaminants in such openings, which can at a later time lead to delamination and similar problems of reliability of the PBGA package. FIG. 3 highlights regions 48 which are the referred to openings that must be avoided in the application of the dimples 40 of the invention. For this reason, the openings that are created in the semiconductor device support surface are preferably created at a perimeter of the Plastic Ball Grid Array substrate, avoiding entrapment of voids trapped and/or contaminants between the heat sink and the Plastic Ball Grid Array substrate.

Figure 4A:
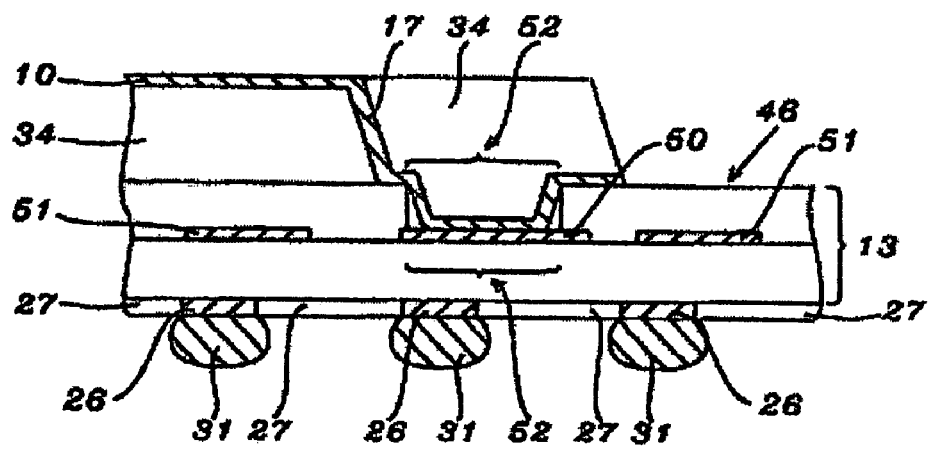
FIG. 4a shows a second detail of the alignment of the dimples of a heat sink with the recesses that are created in the PBGA substrate of the invention, the dimples of the heat sink have been inserted into the recesses of the PBGA substrate.

The cross section of FIG. 4a shows in detail the proper application of the heat sink of the invention, that is:
an opening 52 is created into the surface 46 of IC supporting substrate 13; this opening penetrates the substrate down to layer
50, a ground pad or the surface of a ground plane that is part of substrate 13 is reached; the heat sink 10 is positioned above the substrate with dimple 40 being roughly aligned with opening 52
51 are patterned layers of metal which are in the same plane as metal layer 50 and which may or may not be connected with layer 50 and therefore may or may not be ground metal
the heat sink 10 is lowered onto the surface 46 of substrate 13 with the dimple 40 penetrating opening 52 to the point where the lower surface of dimple 40 rests on the surface of layer 50, making electrical contact with this layer.

Figure 4B:
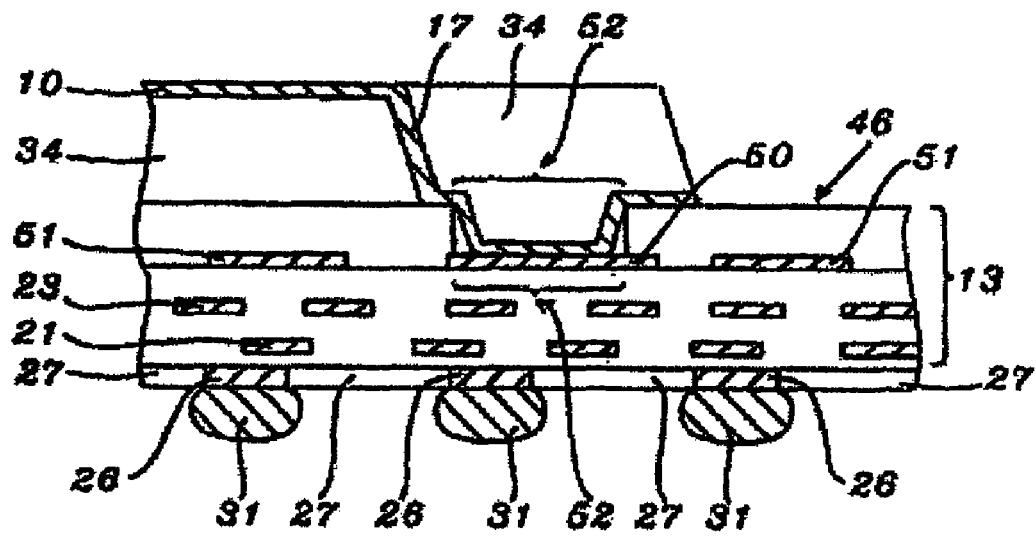
FIG. 4b is similar to the cross section that is shown FIG. 4a, the cross section that is shown in FIG. 4b has additional layers of interconnect traces added to the substrate.

FIG. 4b is similar to the cross section that is shown FIG. 4a, the cross section that is shown in FIG. 4b has additional layers 21 and 23 of interconnect traces in the substrate 13.

Figure 5:
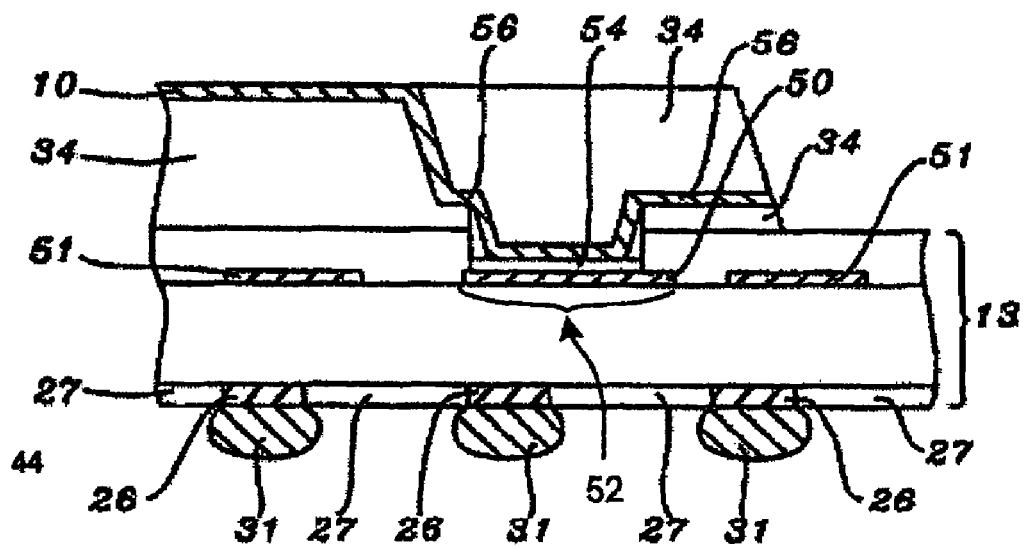
FIG. 5 shows a third detail of the alignment of the dimples of a heat sink with the recesses that are created in the PBGA substrate of the invention; the dimples of the heat sink have been inserted into the recesses of the PBGA substrate, a layer of thermally conductive epoxy has been applied.

An alternate method of the invention is shown in cross section in FIG. 5, where thermally conductive epoxy 54 has been deposited over the surface of the bottom of opening 52 prior to the positioning and lowering of the heat sink 10 over and into opening 52. It must be noted in the cross section of FIG. 5 that electrical contact is not necessarily established between the heat sink 10 and an underlying layer 50 of metal. The horizontal portions 56 of dimple 40 are, in the cross section that is shown in FIG. 5, elevated with respect to surface 46, inhibiting the establishment of electrical contact between the dimple 40 and underlying metal surfaces. Dimple 40 is for these applications as yet used for the main purpose that has been explained for the use of dimple 40, that is to position the heat sink 10 with respect to the underlying IC supporting substrate 13.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A package for a semiconductor device, comprising:
a semiconductor device support substrate having at least one layer of interconnect metal in or on the surface thereof connectible to ground and having at least one opening provided in said semiconductor device support substrate, said at least one opening exposing the surface of said at least one layer of interconnect metal; and
a heat sink having elastic means integral therewith for cooperating with said at least one opening to position and secure said heat sink to said semiconductor support substrate.

2. The package of claim 1 wherein said elastic means comprises an elastic dimple having a sloping side for engaging with a corner of said at least one opening for providing at least one direction of positioning.

3. The package of claim 2 wherein said elastic means comprises an elastic dimple having a surface which abuts a surface of said semiconductor device support substrate with no opening therebetween when said heat sink is in contact with said at least one interconnect metal.

4. The package of claim 1 wherein said at least one opening contains at least conductive epoxy, electroplating, or a combination thereof.

5. The package of claim 4 wherein said at least one opening contains thermally conductive epoxy inhibiting electrical contact between said heat sink and said at least one layer of interconnect metal.

6. The package of claim 1 wherein said semiconductor device support substrate has characteristics of said at least one opening having been provided by laser drilling, plasma drilling, mechanical drilling, or milling.

7. The package of claim 1 wherein said heat sink comprises at least one leg having said elastic means and said elastic means comprises an elastic dimple at the end of said at least one leg and engaging said at least one opening in said semiconductor device support substrate.

8. The package of claim 1 wherein said at least one opening and said elastic means are in a perimeter of said substrate to avoid entrapment of voids trapped or contaminants between said heat sink and the semiconductor device.

9. The package of claim 1 wherein said semiconductor device support substrate is at least one of a printed circuit board, a flex circuit, a ceramic substrate, or a combination thereof.

10. The package of claim 1 wherein said semiconductor device support substrate comprises at least one layer of patterned and etched interconnect metal under or on a first or second surface thereof, said at least one layer of interconnect metal being connected to said at least one layer of interconnect metal.

11. A Plastic Ball Grid Array package, comprising:
a semiconductor device support substrate having a first and a second surface provided with patterned and etched interconnect metal in or on the surface thereof, said patterned and etched interconnect metal provided under or on the first surface being conductively connected with said patterned and etched interconnect metal provided under or on the second surface, a least one of said patterned and etched interconnect metals connectible to ground, a plurality of openings provided in the second surface and exposing the surface of said at least one of said patterned and etched interconnect metals;
at least one semiconductor device positioned over the second surface, said at least one semiconductor device electrically connected with said at least one layer of said patterned and etched interconnect metal provided under or on the second surface;
a heat sink positioned over a second surface of said semiconductor device support substrate, said heat sink provided with a plurality of elastic dimples integral therewith and forming an elastic interface between said heat sink and said second surface, said plurality of elastic dimples positioned above and inserted into said plurality of openings provided in the second surface; and
a mold compound over the second surface and encasing said at least one semiconductor device, said heat sink, and said at least one layer of said patterned and etched interconnect metals provided under or on the second surface.

12. The Plastic Ball Grid Array package of claim 11 wherein said plurality of elastic dimples have sloping sides for engaging with corners of said plurality of openings.

13. The Plastic Ball Grid Array package of claim 12 wherein said plurality of elastic dimples have surfaces which abut the second surface with no opening therebetween when said heat sink is in contact with said a least one of said patterned and etched interconnect metals.

14. The Plastic Ball Grid Array package of claim 11 wherein said plurality of openings contain at least conductive epoxy, electroplating, or a combination thereof on said a least one of said patterned and etched interconnect metals connectible to ground.

15. The Plastic Ball Grid Array package of claim 14 wherein said plurality of openings contain thermally conductive epoxy inhibiting electrical contact between said heat sink and said a least one of said patterned and etched interconnect metals.

16. The Plastic Ball Grid Array package of claim 11 wherein said semiconductor device support substrate has characteristics of said at least one opening having been provided by laser drilling, plasma drilling, mechanical drilling, or milling.

17. The Plastic Ball Grid Array package of claim 11 wherein said heat sink has a plurality of legs, each of said plurality of legs having one of said plurality of elastic dimples at the end thereof and each of said plurality of elastic dimples engaging one of said plurality of openings.

18. The Plastic Ball Grid Array package of claim 11 wherein said plurality of openings and said plurality of elastic dimples are in a perimeter of said Plastic Ball Grid Array package to avoid entrapment of voids or contaminants between said heat sink and said at least one semiconductor device.

19. The Plastic Ball Grid Array package of claim 11 wherein said semiconductor device support substrate is at least one of a printed circuit boards, a flex circuit, a ceramic substrate, or a combination thereof.

20. The Plastic Ball Grid Array package of claim 11 wherein said semiconductor device support substrate comprises at least one layer of interconnect metal therein, said at least one layer of interconnect metal being connected to said layers of patterned and etched interconnect metal.

* * * * *